US010396732B2

(12) United States Patent
Abdo

(10) Patent No.: US 10,396,732 B2
(45) Date of Patent: Aug. 27, 2019

(54) AMPLIFICATION OF FREQUENCY MULTIPLEXED MICROWAVE SIGNALS USING CASCADING MULTI-PATH INTERFEROMETRIC JOSEPHSON DIRECTIONAL AMPLIFIERS WITH NONOVERLAPPING BANDWIDTHS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 74 days.

(21) Appl. No.: 15/829,099

(22) Filed: Dec. 1, 2017

(65) Prior Publication Data

US 2019/0173445 A1 Jun. 6, 2019

(51) Int. Cl.
*H03F 19/00* (2006.01)
*H01L 39/22* (2006.01)
(Continued)

(52) U.S. Cl.
CPC ........... *H03F 19/00* (2013.01); *H01L 39/223* (2013.01); *H01L 39/2493* (2013.01); *H03F 7/00* (2013.01)

(58) Field of Classification Search
CPC ......... H03F 7/00; H03F 19/00; H01L 39/025; H01L 39/2493
(Continued)

(56) References Cited

U.S. PATENT DOCUMENTS 4,162,323 A    7/1979    Kahan
6,374,093 B1    4/2002    Pesola
(Continued)

FOREIGN PATENT DOCUMENTS

JP    2009194646 A    8/2009
KR    100604396 B1    7/2006
(Continued)

OTHER PUBLICATIONS

Abdo et al., "Josephson Directional Amplifier for Quantum Measurement of Superconducting Circuits", 10.1103/PhysRevLett.112.167701, Physical Review Letters, Apr. 25, 2014 (Year: 2014).*
(Continued)

*Primary Examiner* — Benny T Lee
*Assistant Examiner* — Hafizur Rahman
(74) *Attorney, Agent, or Firm* — Garg Law Firm, PLLC; Rakesh Garg; Grant Johnson

(57) ABSTRACT

A cascading microwave directional amplifier (cascade) includes a set of Josephson devices, each Josephson device in the set having a corresponding operating bandwidth of microwave frequencies, wherein different operating bandwidths have different corresponding center frequencies. A series coupling is formed between first Josephson device from the set and an $n^{th}$ Josephson device from the set, such that the first Josephson device amplifies a signal of a first frequency from a frequency multiplexed microwave signal (multiplexed signal) and propagate without amplification a signal of an $n^{th}$ frequency, and the $n^{th}$ Josephson device to amplify the signal of the $n^{th}$ frequency and propagate without amplification the signal of the first frequency from the multiplexed signal in the first signal flow direction through the series.

18 Claims, 8 Drawing Sheets

(51) Int. Cl.
*H01L 39/24* (2006.01)
*H03F 7/00* (2006.01)

(58) Field of Classification Search
USPC .......................................................... 330/4.5
See application file for complete search history.

(56) References Cited

U.S. PATENT DOCUMENTS

| | | | |
|---|---|---|---|
| 9,130,508 | B1 | 9/2015 | Kang et al. |
| 9,735,776 | B1 | 8/2017 | Abdo |
| 9,787,278 | B1 | 10/2017 | Abdo |
| 2013/0214979 | A1 | 8/2013 | McMillin et al. |
| 2016/0308502 | A1 | 10/2016 | Abdo |
| 2016/0380636 | A1 | 12/2016 | Abdo |
| 2017/0093381 | A1 | 3/2017 | Abdo |

FOREIGN PATENT DOCUMENTS

| | | |
|---|---|---|
| WO | 03034542 A1 | 10/2002 |
| WO | 2015057839 A1 | 4/2015 |
| WO | 20150057839 A1 | 4/2015 |
| WO | 2016094045 A1 | 6/2016 |

OTHER PUBLICATIONS

Appendix P, 2017.
PCT, International Searching Authority, PCT/IB 2017/057987, dated Aug. 22, 2018.
PCT, International Searching Authority, PCT/E P2018/050247, dated Aug. 6, 2018.
PCT, International Searching Authority, PCT/E P2018/050244, dated Aug. 24, 2018.
PCT, International Searching Authority, PCT/E P2018/050245, dated Sep. 7, 2018.
PCT, International Searching Authority, PCT/EP2018/050251, dated Aug. 29, 2018.
PCT, International Searching Authority, PCT/EP2018/050246, 2005.
PCT, Written Opinion of the International Searching Authority (Separate Sheet), PCT/EP2018/050253, 1SA/237, EPO—dated Apr. 2005.
Frattini NE et al: '3-wave mixing Josephson dipole element', Applied Physics Letters, A I P Publishing LLC, US, vol. 110, No. 22, May 31, 2017 (May 31, 2017), XP012219271, ISSN: 0003-6951, DOI: 10.1063/1.4984142, retrieved on May 31, 2017.
Baleegh Abdo et al: "Multi-Path 1,4,12, Interferometric Josephson Directional 13 ,16 Amplifier for Qubit Readout", Arxiv.Org, Cornell University Library, 281 OLIN Library Cornell University Ithaca, NY 14853, Oct. 8, 2017 (Oct. 8, 2017) , XP888826758, A p. 2, paragraph 4—p. 5, paragraph 1—, 2,3, figures 1-3.
Baleegh Abdo et al: "Directional Amplification with a Josephson Circuit", Physical Review X, vol. 3, No. 3, Jul. 1, 2013 (Jul. 1, 2013), XP055493386, DOI: 10.1103/PhysRevX.3.031001 A p. 2, left-hand column, paragraph 4 p. 3, left-hand column, paragraph 2; figure 1, p. 3, right-hand column, paragraph 3 p. 4, left-hand column, paragraph 1; figure 2.
Westig MP et al: "Josephson parametric reflection amplifier with integrated directionality", Arxiv.Org, Cornell University Library, 201 OLIN Library Cornell University Ithaca, NY 14853, Jun. 28, 2017 (Jun. 28, 2017), XP080773209, p. 1, right-hand column, paragraph 2; figure 1.
Bergeal N et al: "Analog information processing at the quantum limit with a Josephson ring modulator", Arxiv.Org, Cornell University Library, 201 OLIN Library Cornell University Ithaca, NY 14853, May 22, 2008 (May 22, 2008), XP080419198, DOI: 10.1038/NPHYS1516, p. 5-p. 15.
Naaman et al: "On-chip Josephson 1-6, junction microwave switch", 11-17, Applied Physics Letters, A I P Publishing LLC, US, vol. 108, No. 11, Mar. 14, 2016 (Mar. 14, 2016), pp. 112601-1, XP012205944, ISSN: 0003-6951, 001: 10.1063/1.4943602.
List of All IBM Related Applications, Appendix P, 2019.
PCT, International Searching Authority, PCT/E P2018/050247, dated Jun. 8, 2018.

\* cited by examiner

AMPLIFICATION OF FREQUENCY MULTIPLEXED MICROWAVE SIGNALS USING CASCADING MULTI-PATH INTERFEROMETRIC JOSEPHSON DIRECTIONAL AMPLIFIERS WITH NONOVERLAPPING BANDWIDTHS

TECHNICAL FIELD

The present invention relates generally to a device, a fabrication method, and fabrication system for a frequency multiplexed microwave light amplifier usable with superconducting qubits in quantum computing. More particularly, the present invention relates to a device, method, and system for amplification of frequency-multiplexed microwave signals using cascading multi-path interferometric Josephson directional amplifiers in nonoverlapping bandwidths, where the directional amplifiers are based on nondegenerate three-wave-mixing Josephson devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature —pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

A directional microwave amplifier is a device that increases the power of microwave light waves (amplify) when passing through the device in one direction (significant forward gain in the forward direction), and passes without any significant amplification or attenuation the microwave light waves when attempting to pass through it in the opposite direction (insignificant reverse gain in the reverse direction). A reference herein to an "amplifier" is a reference to a directional microwave amplifier. In other words, the amplifier operates as a microwave light power enhancer, and the response of the device is dependent on the direction in which the microwave light is propagating through the device. Low-noise amplifiers are used in quantum computing for amplifying weak microwave signals into and out of the quantum processor in a specified flow direction, while adding no or little noise to the processed signal.

A multi-path interferometric Josephson directional amplifier based on nondegenerate three-wave-mixing Josephson parametric devices is hereinafter compactly and interchangeably referred to as Multi-Path Interferometric Josephson Directional Amplifier (MPIJDA). An MPIJDA device can be implemented as a microwave amplifier in a superconducting quantum circuit. The directional amplification in an MPIJDA is generated by applying a phase gradient between the two pump tones driving the device. An MPIJDA substantially amplifies in the forward direction the signals whose frequencies lie within the bandwidth of the MPIJDA. Signals propagating in the reverse direction whose frequencies lie within the bandwidth of the MPIJDA get amplified by a small (insignificant) amount on the order of 2 dB, whereas signals whose frequencies lie outside the band of the MPIJDA get transmitted without gain or with a negligible gain in the reverse direction. For the purposes of the clarity of the description, amplification of a signal of any frequency in the reverse direction through an MPIJDA is regarded as zero-gain.

A superconducting nondegenerate three-wave-mixing parametric amplifier device can be used as part of the MPIJDA by operating the device in an amplification (photon gain) mode. The nondegenerate three-wave parametric amplifier can be a Josephson parametric converter (JPC).

A superconducting nondegenerate three-wave-mixing parametric amplifier has 3 ports, which are Signal port (S) through which a microwave signal of frequency $f_S$ can be input, Idler port (I) through which an idler microwave signal of frequency $f_I$ can be input, and pump port (P) through which microwave signal of frequency $f_P$, power $P_p$, and phase $\varphi_p$ can be input. The superconducting nondegenerate three-wave-mixing parametric amplifier is characterized as nondegenerate because it has two modes, namely S and I, which are both spatially and spectrally different.

Two suitable manifestations of the nondegenerate three-wave-mixing parametric amplifier, each operating in the limit of small gains 3-7 dB are used as one component in an MPIJDA according to the illustrative embodiments. JPC is one such non-limiting manifestation.

In quantum circuits, microwave signals can include signals of more than one frequency. Generally, the microwave signals span a band of frequencies. An MPIJDA generally operates with a comparatively narrow band of signal frequencies around a central frequency for which the MPIJDA is tuned. The illustrative embodiments recognize that a new amplifier design is needed that is capable of amplifying signals at all or some microwave signals having different, even if a frequency of a signal lies outside the operational frequency band of a single MPIJDA.

SUMMARY

The illustrative embodiments provide a superconducting device, and a method and system of fabrication therefor. A superconducting device of an embodiment forms a cascading microwave directional amplifier (cascade), which includes a set of Josephson devices, each Josephson device in the set having a corresponding operating bandwidth of microwave frequencies, wherein different operating bandwidths have different corresponding center frequencies. The embodiment includes a series coupling between first Josephson device from the set and an $n^{th}$ Josephson device from the set, wherein the series coupling causes the first Josephson device to amplify a signal of a first frequency from a frequency multiplexed microwave signal (multiplexed signal) and propagate without amplification a signal of an $n^{th}$ frequency from the multiplexed signal in a first signal flow direction through the series coupling, and the $n^{th}$ Josephson device to amplify the signal of the $n^{th}$ frequency and propagate without amplification the signal of the first frequency from the multiplexed signal in the first signal flow direction through the series.

Another embodiment further includes an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device amplifies a signal of an $(n-1)^{th}$ frequency from the multiplexed signal in the first signal flow direction.

In another embodiment, the series coupling causes the first Josephson device to propagate without amplification the signal of the $n^{th}$ frequency from the multiplexed signal in the first signal flow direction through the series coupling and the $n^{th}$ Josephson device to propagate without amplification the signal of the first frequency in the first signal flow direction through the series.

In another embodiment, the series coupling causes the first Josephson device and the $n^{th}$ Josephson device to propagate without amplification signals of all frequencies from the multiplexed signal in a second signal flow direction through the series coupling, wherein the second signal flow direction is opposite of the first signal flow direction, and wherein the first signal flow direction is a direction of amplification of the first Josephson device and the $n^{th}$ Josephson device.

In another embodiment, a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

In another embodiment, a total amplification bandwidth of the cascade comprises the first operating bandwidth and the $n^{th}$ operating bandwidth.

In another embodiment, the first Josephson device in the set of Josephson devices is an MPIJDA, which includes a first nondegenerate microwave parametric amplifier device (first parametric amplifier); a second nondegenerate microwave parametric amplifier device (second parametric amplifier); a first input/output (I/O) port coupled to an input port of the first parametric amplifier and an input port of the second parametric amplifier; and a second I/O port coupled to the input port of the first parametric amplifier and the input port of the second parametric amplifier, wherein the signal of a first frequency communicated between the first I/O port and the second I/O port is transmitted while propagating in a first direction between the first I/O port to the second I/O port through the first parametric amplifier and the second parametric amplifier and is substantially unamplified while propagating in a second direction between the second I/O port to the first I/O through the first parametric amplifier and the second parametric amplifier, and wherein the first frequency is in a first operating bandwidth of the first Josephson device. That is, the amplifier device either performs amplification (the signal is in band and its direction of propagation is aligned with the direction of the amplification of the amplifier), or unity transmission (the signal is out of band, the direction does not matter), or insignificant amplification (the signal is in band and its direction of propagation is opposite to the direction of the amplification of the amplifier).

Another embodiment further includes a first microwave pump injecting a first microwave drive into the first parametric amplifier at a pump frequency and a first pump phase, wherein the first microwave pump is configured to cause the first parametric amplifier to operate at a low power gain working point; and a second microwave pump injecting a second microwave drive into the second parametric amplifier at the pump frequency and a second pump phase wherein the second microwave pump is configured to cause the second parametric amplifier to operate at the low power gain working point.

In another embodiment, the first parametric amplifier and the second parametric amplifier are each a nondegenerate three-wave-mixing parametric amplifier.

In another embodiment, the first parametric amplifier and the second parametric amplifier are each a Josephson parametric converter (JPC), and wherein the first parametric amplifier and the second parametric amplifier are nominally identical.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
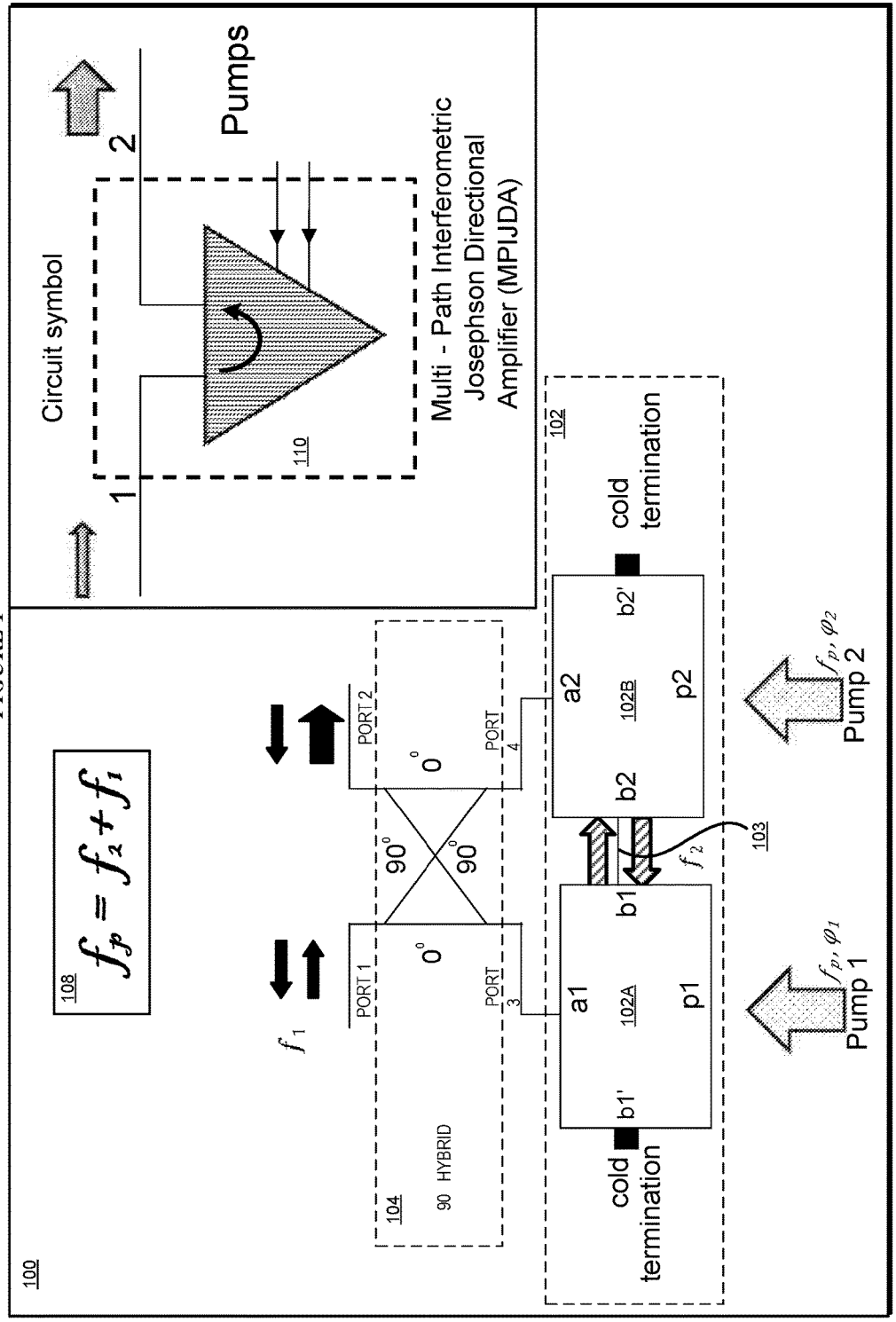
FIG. 1 depicts a block diagram of an example configuration of an MPIJDA that is usable in a cascade in accordance with an illustrative embodiment.

The illustrative embodiments used to describe the invention generally address and solve the above-described needs for amplification of signals of some or all frequency-multiplexed microwave signals. The illustrative embodiments provide an amplifier device comprising cascading multi-path interferometric Josephson directional amplifiers having nonoverlapping bandwidths, where the amplifiers are based on nondegenerate three-wave-mixing parametric amplifier Josephson devices. Such a cascading amplifier device is compactly referred to herein as a cascading MPIJDA.

An operation described herein as occurring with respect to a frequency of frequencies should be interpreted as occurring with respect to a signal of that frequency or frequencies. All references to a "signal" are references to a microwave signal unless expressly distinguished where used.

The term "frequency multiplexed signal" refers to a composite signal which includes multiple signals at various frequencies and is therefore not different from the term "frequency multiplexed signals", which refers to signals at various frequencies multiplexed together. The two terms are therefore used interchangeably to mean more than one signals of different frequencies multiplexed or presented together to a device or in an operation.

An embodiment provides a configuration of a cascading MPIJDA. Another embodiment provides a fabrication method for the cascading MPIJDA, such that the method can be implemented as a software application. The application implementing a fabrication method embodiment can be configured to operate in conjunction with an existing superconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example parametric amplifiers, hybrids, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a cascading MPIJDA, and such adaptations are contemplated within the scope of the illustrative embodiments.

The illustrative embodiments are described with respect to certain types of materials, electrical properties, steps, numerosity, signal frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of an MPIJDA that is usable in a cascade in accordance with an illustrative embodiment. MPIJDA configuration 100 comprises pair 102 of nondegenerate three-wave-mixing parametric amplifier 102A and nondegenerate three-wave-mixing parametric amplifier 102B. Each of nondegenerate three-wave-mixing parametric amplifier 102A and nondegenerate three-wave-mixing parametric amplifier 102B is operating at a low power gain working point.

Nondegenerate three-wave-mixing parametric amplifier 102A is configured with physical ports a1 (corresponding to signal port S), b1 (corresponding to signal port I), p1 (corresponding to signal port P), and b1' (corresponding to signal port I). The pump frequency ($f_P$) is a sum of idler frequency ($f_2$) and input signal frequency ($f_1$) according to expression 108. Physical port b1' is terminated using a cold terminator. For example, the cold termination of port b1' may be a 50 Ohm termination.

Nondegenerate three-wave-mixing parametric amplifier 102B is configured with physical ports a2, b2, p2, and b2', pump frequency ($f_P$), and a cold terminator in a similar manner as amplifier 102A. Port b1 of amplifier 102A and port b2 of amplifier 102B are coupled together using transmission line 103.

Ports 1 and 2 of 90-degree hybrid 104 form ports 1 and 2, respectively, of MPIJDA 100, as described herein. Port a1 of nondegenerate three-wave-mixing parametric amplifier 102A is coupled with port 3 of hybrid 104. Port a1 of nondegenerate three-wave-mixing parametric amplifier 102B is coupled with port 4 of hybrid 104.

Figure 2:
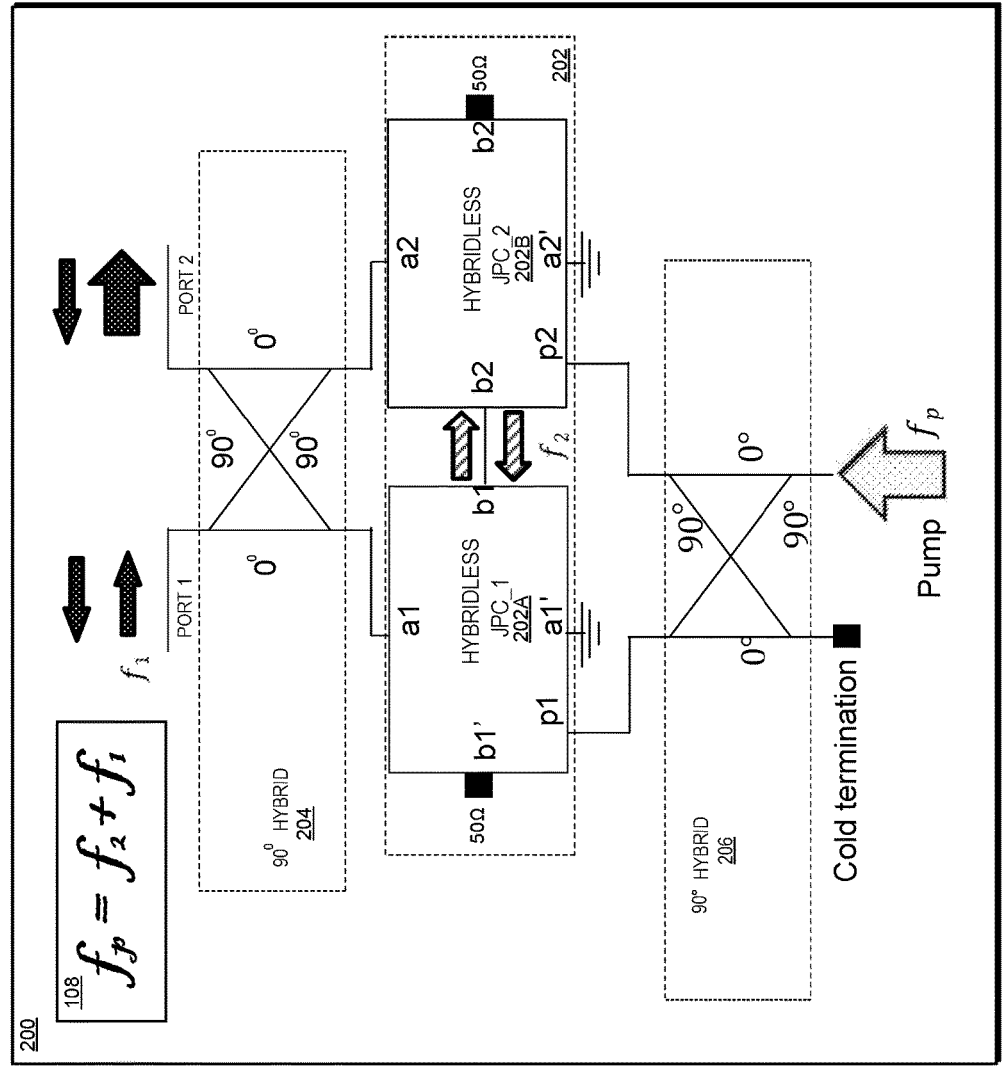
FIG. 2 depicts another alternate configuration for an MPIJDA that is usable in a cascade in accordance with an illustrative embodiment.

This configuration 100 of nondegenerate three-wave parametric amplifiers 102A and 102B, and other possible similarly-purposed configurations using the described components, is compactly represented as symbol 110. For example, FIG. 2 depicts another possible similarly-purposed configuration using the described components. The rounded arrow inside the block of symbol 110 represents an amplifying direction of the signal from port 1 to port 2 in symbol 110. In other words, MPIJDA 110 does not amplify the signal from port 2 to port 1 but amplifies the signal from port 1 to port 2.

This series connection of the MPIJDA devices is not intuitive. In a normal series coupling of electrical or electronic elements, a parameter of the series is limited (e.g., the bandwidth of the series) by the weakest/smallest/lowest value of the parameter in the serial chain. The entire series of the elements operates at that weakest/smallest/lowest value. In contrast, the cascade of MPIJDA devices, due to the special properties of the MPIJDA devices used therein, out-of-band signals (a signal of a frequency that is not in the device's bandwidth) are not acted upon and allowed to simply pass through, and each device acts (amplifies) only upon that part of the signal that lies in its own bandwidth, thus providing a non-intuitive additive span in the bandwidth.

With reference to FIG. 2, this figure depicts another alternate configuration for an MPIJDA that is usable in a cascade in accordance with an illustrative embodiment. Hybrid 204 is a 90-degree hybrid and is configured with hybrid-less JPC 202A and hybrid-less JPC 202B in a manner substantially as hybrid 104 is configured with nondegenerate three-wave-mixing parametric amplifiers 102A and 102B in FIG. 1. Configuration 200 uses a single pump drive in conjunction with hybrid 206 to provide the pump input to hybrid-less JPC 202A and hybrid-less JPC 202B. Configuration 200 is also represented by symbol 110.

Figure 3:
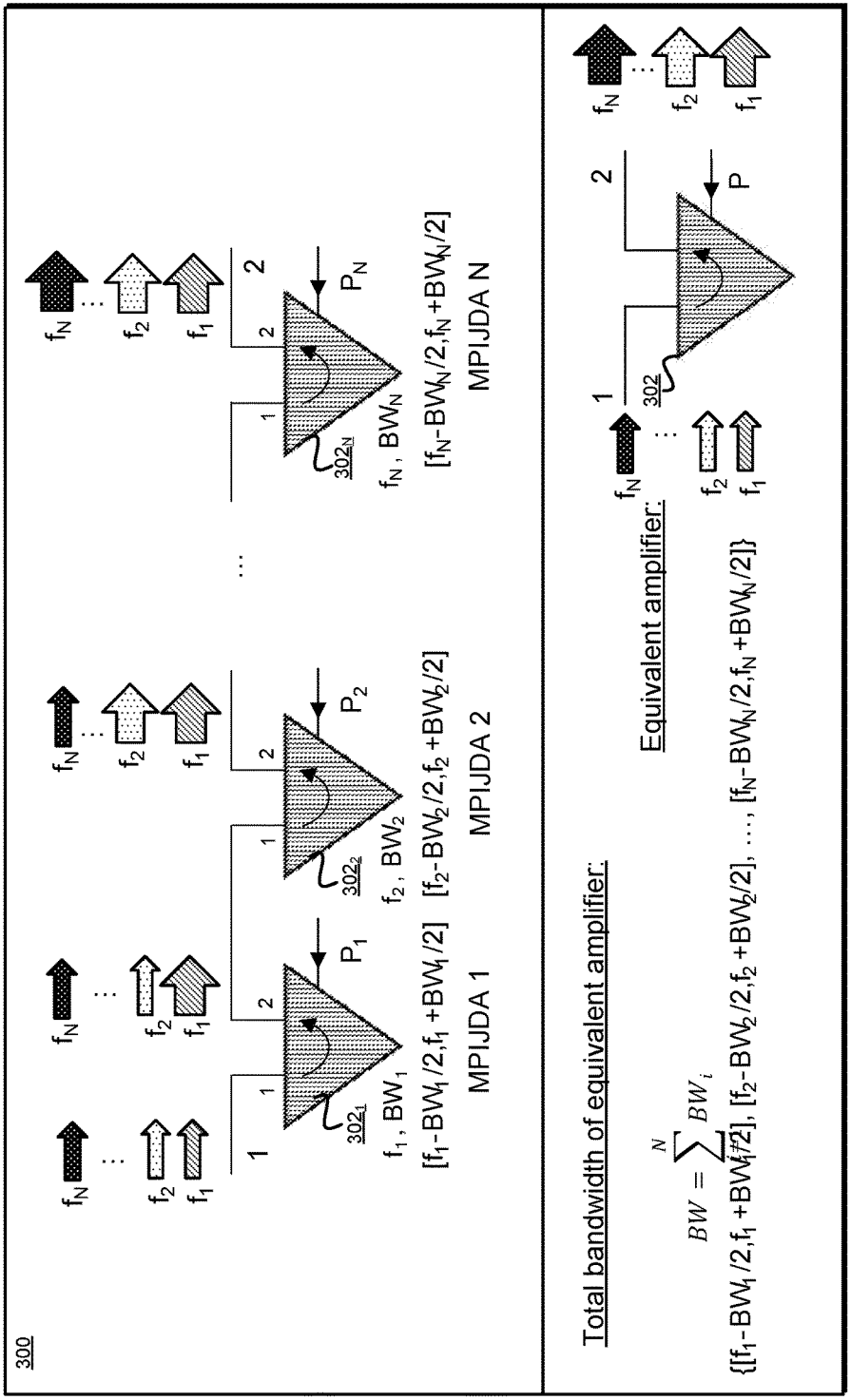
FIG. 3 depicts a block diagram of an example configuration and an amplifying operation of a cascading MPIJDA in accordance with an illustrative embodiment.
Figure 4:
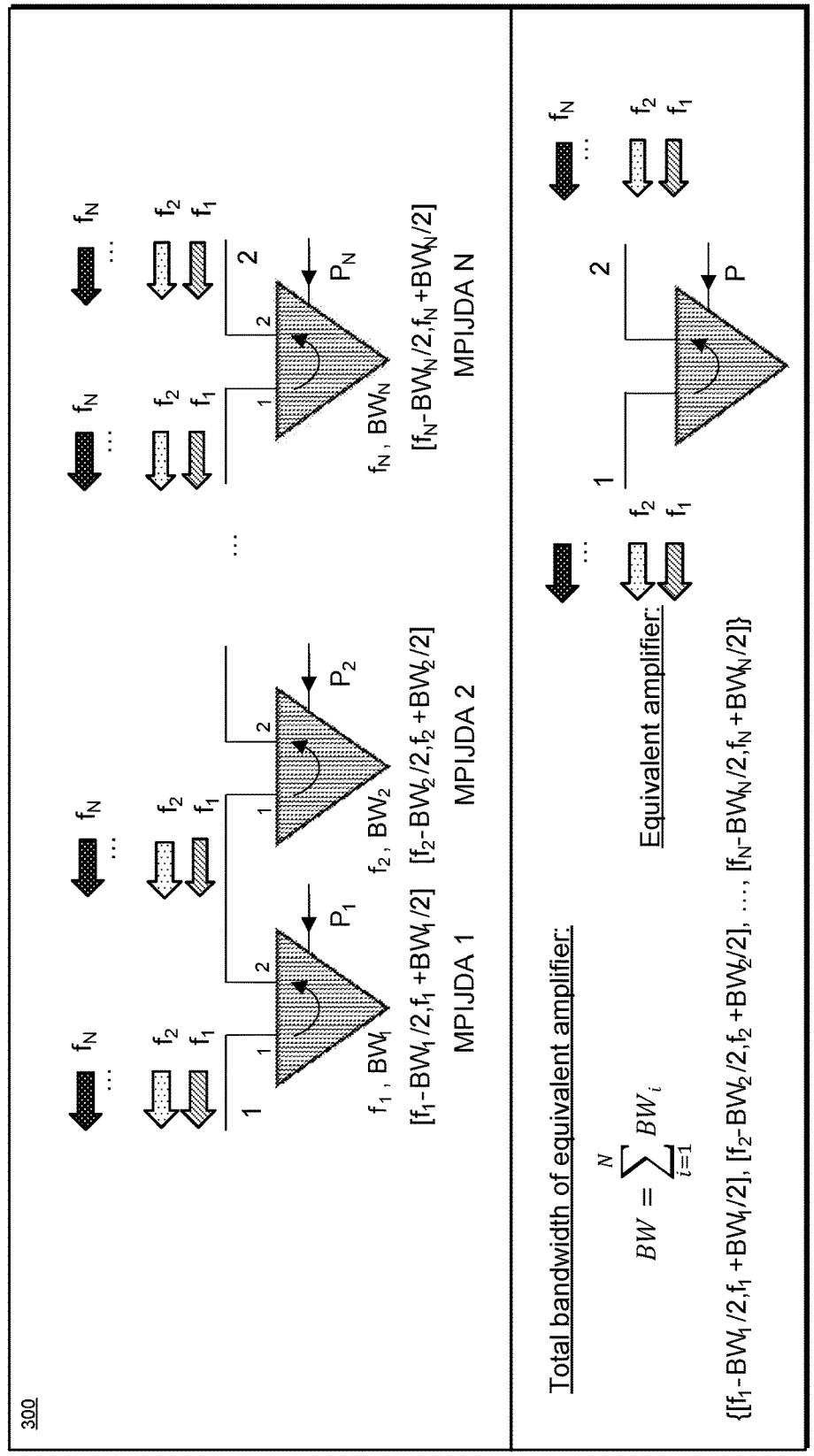
FIG. 4 depicts a block diagram of an example of a close to zero gain pass-through reverse operation of a cascading MPIJDA in accordance with an illustrative embodiment.
Figure 5:
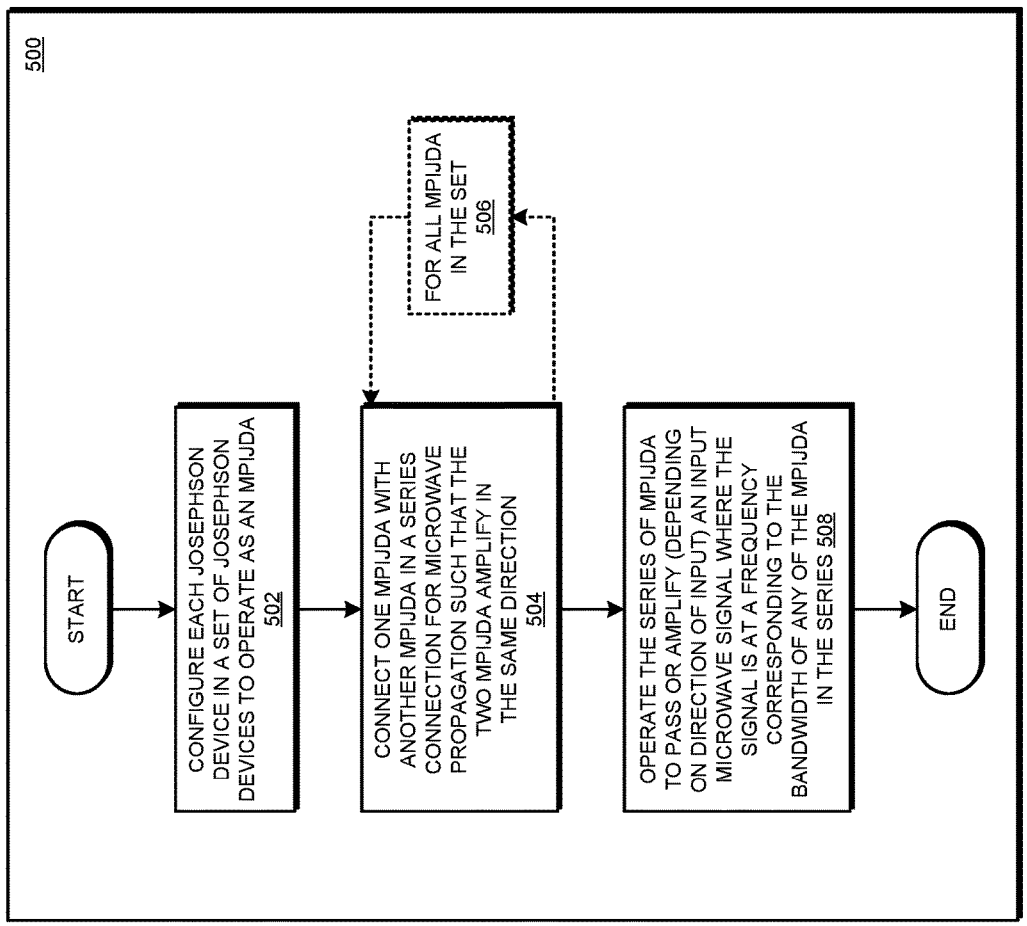
FIG. 5 depicts a flowchart of an example process for propagation with or without amplification of signals of all frequencies in a frequency multiplexed microwave signal using cascading multi-path interferometric Josephson directional amplifiers with nonoverlapping bandwidths in accordance with an illustrative embodiment.
Figure 6:
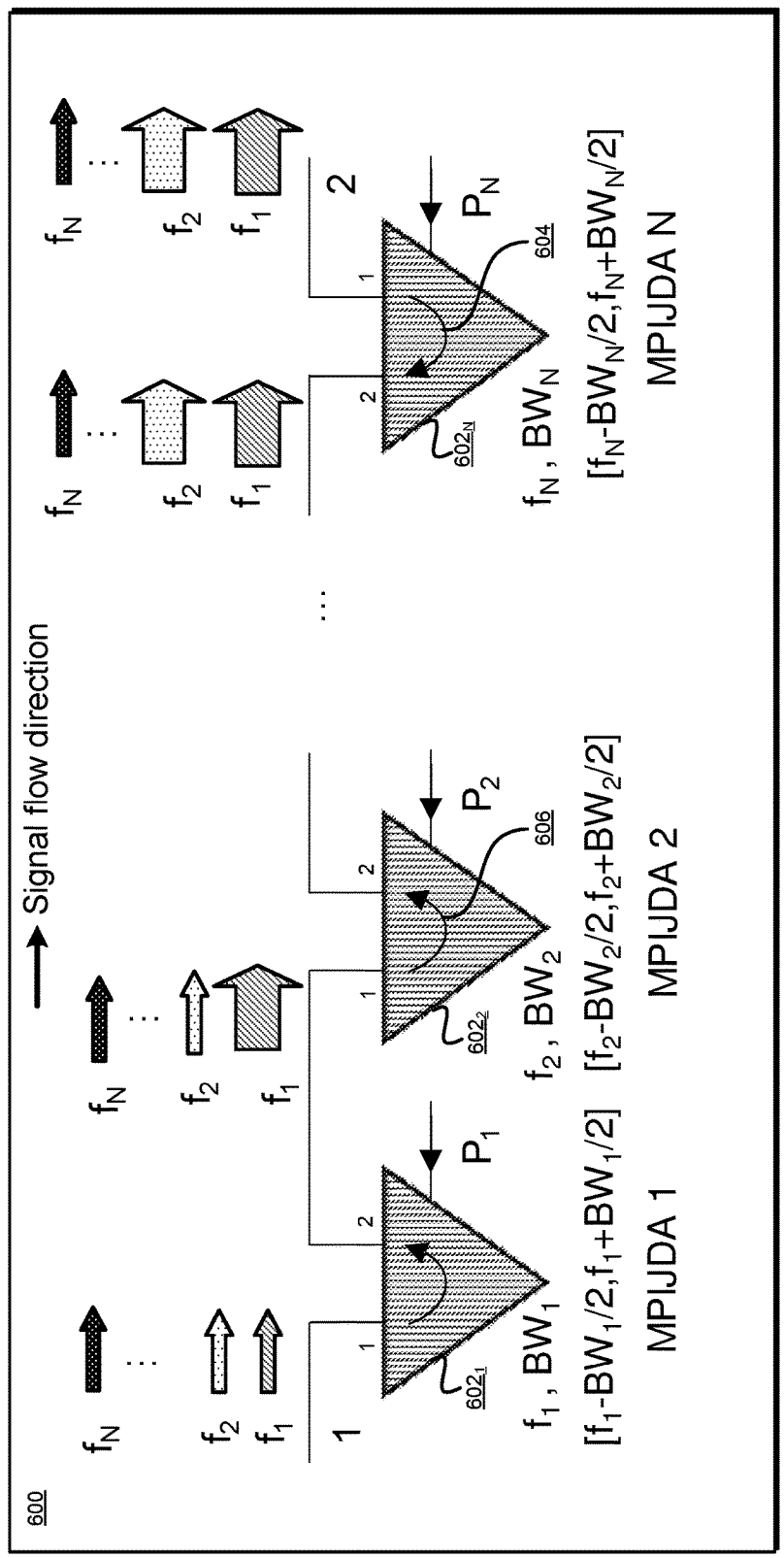
FIG. 6 depicts a block diagram of an example configuration and a selective amplification operation of a cascading MPIJDA in accordance with an illustrative embodiment.
Figure 7:
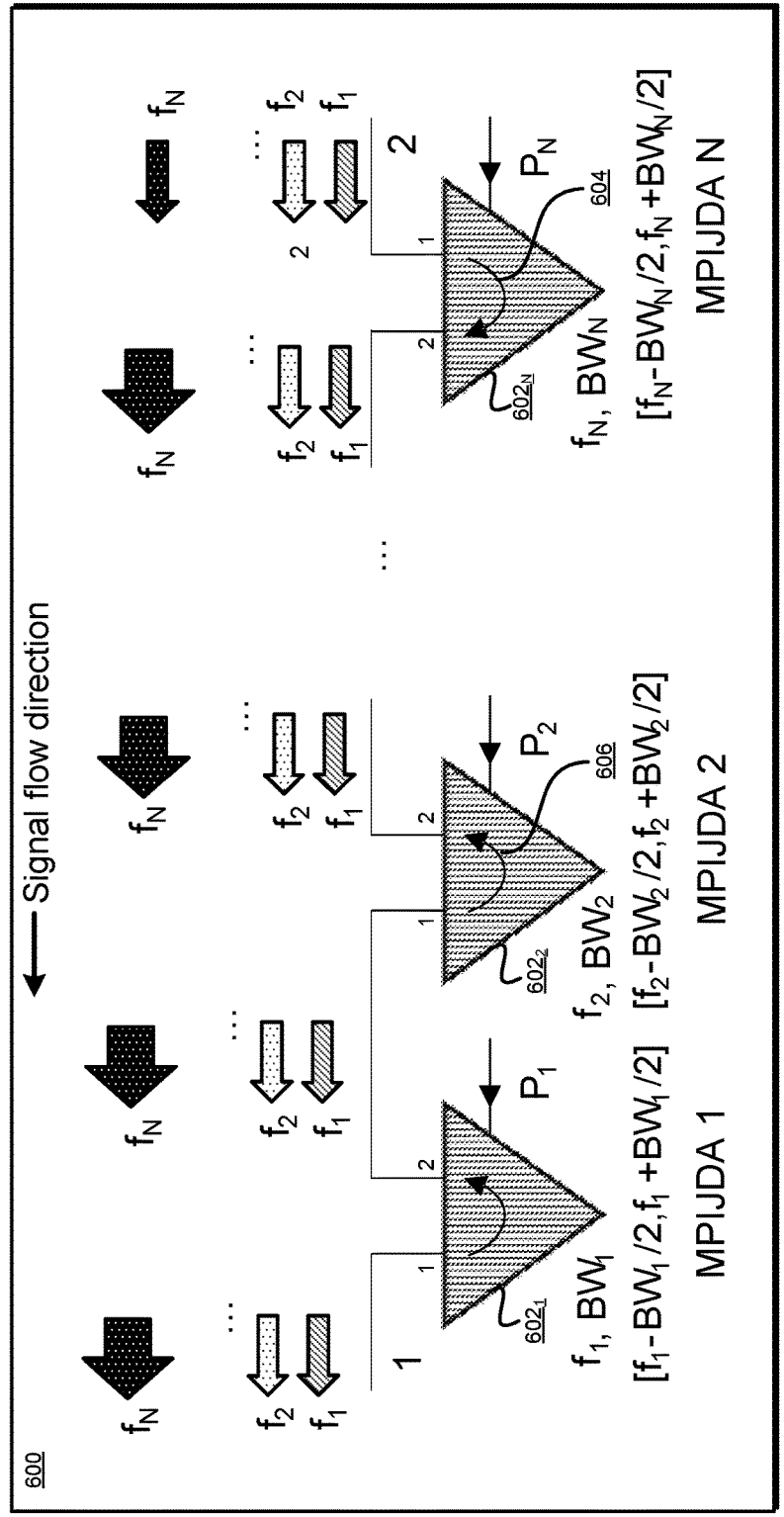
FIG. 7 depicts a block diagram of an example selective amplification operation of a cascading MPIJDA in accordance with an illustrative embodiment.
Figure 8:
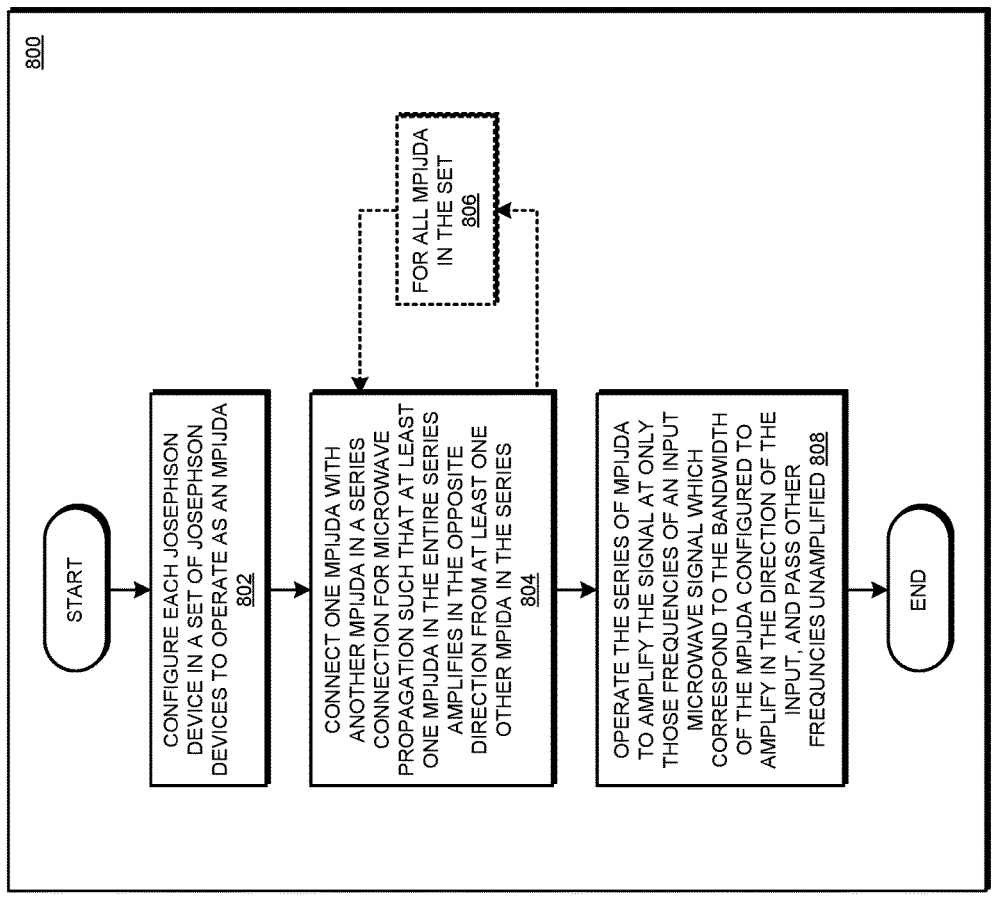
FIG. 8 depicts a flowchart of an example process for near zero-gain propagation or amplification of signals of some but not all frequencies in a frequency multiplexed microwave signal using cascading multi-path interferometric Josephson directional amplifiers with nonoverlapping bandwidths in accordance with an illustrative embodiment.

FIGS. 3-5 describe a cascading configuration and a manner of operating the same, to amplify or pass without amplification signals of all frequency-multiplexed microwave signals having different frequencies. FIGS. 6-8 describe a different cascading configuration and a manner of operating the same, to selectively amplify or pass without amplification signals of some but not all frequency-multiplexed microwave signals.

With reference to FIG. 3, this figure depicts a block diagram of an example configuration and an amplifying operation of a cascading MPIJDA in accordance with an illustrative embodiment. This cascading configuration amplifies signals of all frequency-multiplexed microwave signals having different frequencies that are within the bandwidth of any of the cascaded MPIJDA devices. Each of MPIJDA devices $302_1$, $302_2$ . . . $302_N$ is an MPIJDA according to symbol 110. MPIJDA devices $302_1$-$302_N$ represent N MPIJDA devices (N>1) that are cascaded in configuration 300.

A cascading of MPIJDA devices is a series connection of MPIJDA devices whereby port 1 of the first MPIJDA ($302_1$) is coupled to an external circuit for receiving a microwave signal input (assuming that cascade 300 is operating in the direction of amplification as shown by the rounded arrows); port 2 of the first MPIJDA ($302_1$) is coupled to port 1 of the next MPIJDA ($302_2$); port 2 of the next MPIJDA ($302_2$) is coupled to port 1 of the next MPIJDA, and so on, until port 2 of N−1th MPIJDA is coupled to port 1 of the last MPIJDA ($302_N$), and port 2 of the last MPIJDA ($302_N$) is coupled to an external circuit to which cascade 300 provides an amplified microwave signal output.

Each MPIJDA $302_1$-$302_N$ is configured in cascade 300 such that each MPIJDA $302_1$-$302_N$ amplifies an input signal in the same direction (direction of the rounded arrows in their respective symbols, which are all facing the same direction), and pass without amplifying in the same opposite direction (opposite of the direction of the rounded arrows in their respective symbols).

Furthermore, each MPIJDA $302_1$-$302_N$ in cascade 300 operates in a substantially nonoverlapping frequency band. For example, MPIJDA $302_1$ operates in a narrow bandwidth ($BW_1$) where a center frequency is $f_1$, i.e., half of $BW_1$ is below $f_1$ and includes $f_1$ and half of $BW_1$ is above $f_1$. Therefore, $BW_1$ is [$f_1$−$BW_1/2$ to $f_1$+$BW_1/2$]. Similarly, MPIJDA $302_2$ has a center frequency $f_2$, and $BW_2$ of [$f_2$−$BW_2/2$ to $f_2$+$BW_2/2$]. And the MPIJDA devices in the set are defined in a similar manner until MPIJDA $302_N$ has a center frequency $f_N$, and $BW_N$ of [$f_N$−$BW_N/2$ to $f_N$+$BW_N/2$]. $BW_1$ . . . $BW_N$ do not overlap, or overlap by an insignificant amount.

An MPIJDA in cascading configuration 300 operates only on the bandwidth of frequencies for which it is tuned. In other words, an MPIJDA will amplify (flowing in the direction from port 1 to port 2) and pass without amplifying (flowing in the direction from port 2 to port 1) signals of those frequencies that fall within its operating bandwidth. The MPIJDA will pass without amplifying in both directions, in a substantially zero gain manner, signals of frequencies outside of the operating bandwidth of that MPIJDA.

For example, MPIJDA $302_2$ will only amplify a signal of a frequency (with substantial power gain) in $BW_2$ if flowing from port 1 of MPIJDA $302_2$ to port 2 of MPIJDA $302_2$, but will allow signals of frequencies in $BW_1$, $BW_3$, $BW_4$ . . . $BW_N$ to pass in a substantially zero gain manner in the amplifying direction. MPIJDA $302_2$ will allow signals of frequencies not only in $BW_2$ but also in $BW_1$, $BW_3$, $BW_4$ ... $BW_N$ to pass in a substantially zero gain manner in the non-amplifying direction. Each MPIJDA $302_1$ ... $302_N$ in configuration 300 operates relative to its respective operating bandwidth and signal frequencies outside its operating bandwidth in this manner.

In configuration 300, MPIJDA $302_1$ amplifies signal of frequency $f_1$ in the amplifying direction (compare the size of $f_1$ arrows at ports 1 and 2 of MPIJDA $302_1$ (representative, not to scale)) because MPIJDA $302_1$ signals of frequencies in $BW_1$ and $f_1$ is in $BW_1$. MPIJDA $302_1$ allows signals of frequencies $f_2$ ... $f_N$ to pass without amplification because those signal frequencies are out-of-band from $BW_1$. Similarly, MPIJDA $302_2$ amplifies signal of frequency $f_2$ in the amplifying direction (compare the size of $f_2$ arrows at ports 1 and 2 of MPIJDA $302_2$ (representative, not to scale)) because MPIJDA $302_2$ amplifies the signals of frequencies in its own operating bandwidth $BW_2$ and $f_2$ is in $BW_2$. MPIJDA $302_2$ allows signals of frequencies $f_1$, $f_1$ ... $f_N$ to pass without amplification because those frequencies are outside $BW_2$. MPIJDA $302_N$ amplifies signal of frequency $f_N$ in the amplifying direction (compare the size of $f_N$ arrows at ports 1 and 2 of MPIJDA $302_N$ (representative, not to scale)) because MPIJDA $302_N$ amplifies the signals of frequencies in $BW_N$ and $f_N$ is in $BW_N$. MPIJDA $302_N$ allows signals of frequencies $f_1$ ... $f_{N-1}$ to pass without amplification because those frequencies are outside $BW_N$. Thus, as depicted in this figure, an input signal that multiplexes signals of frequencies $f_1$, $f_2$ ... $f_N$ sees the powers of the signals at frequencies $f_1$, $f_2$ ... $f_N$ amplified through cascade 300 in the amplifying direction of the participating MPIJDA devices $302_1$ ... $302_N$.

Configuration 300 is represented compactly as cascading MPIJDA 302. The effective bandwidth over which cascading MPIJDA 302 can amplify is therefore, $$BW=\{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

The amplification bandwidth BW of cascading MPIJDA 302 is greater than the amplification bandwidth of any single MPIJDA in configuration 300. Thus, cascading MPIJDA 302 is operable over a broader bandwidth than the operating bandwidth of a single MPIJDA. The amplifying operation of cascading MPIJDA 302 shows signals of multiplexed frequencies $f_1$, $f_2$ ... $f_N$ amplified from port 1 of cascading MPIJDA 302 (which is port 1 of the first MPIJDA in the cascade) to port 2 of cascading MPIJDA 302 (which is port 2 of the last MPIJDA in the cascade).

With reference to FIG. 4, this figure depicts a block diagram of an example of a close to zero gain pass-through reverse operation of a cascading MPIJDA in accordance with an illustrative embodiment. This cascading configuration passes without significant amplification signals of all frequencies in a frequency multiplexed microwave signal. Cascade 300, MPIJDA devices $302_1$, $302_2$ ... $302_N$, and cascading MPIJDA 302 are the same as in FIG. 3. Frequency $f_1$ is in $BW_1$ of MPIJDA $302_1$, $f_2$ is in $BW_2$ of MPIJDA $302_2$ ... $f_N$ is in $BW_N$ of MPIJDA $302_N$.

In the reverse operation of this figure, signals of frequencies $f_1$, $f_2$ ... $f_N$ are input at port 2 of cascade 300, to wit, at port 2 of the last MPIJDA ($302_N$) in cascade 300. In cascade 300, MPIJDA $302_N$ passes signal of in-band frequency $f_N$ and signals of frequencies $f_{N-1}$ ... $f_1$ which are out-of-band $BW_N$ without amplification in the reverse direction (port 2 to port 1). Similarly, N-$1^{th}$ MPIJDA passes signal of in-band frequency $f_{N-1}$ and signals of out-of-band frequencies $f_N$, $f_{N-2}$ ... $f_1$ which are out of bandwidth $BW_{N-1}$ in the reverse direction.

Operating in this manner, each MPIJDA passes signals of each in-band and out-of-band frequency without amplification in the reverse direction. Thus, no signal of any frequency from the multiplexed input signal $f_1$ ... $f_N$ is amplified arriving in the reverse direction at port 1 of cascade 300. Thus, as depicted in this figure, an input signal that multiplexes frequencies $f_1$, $f_2$ ... $f_N$ is substantially unchanged (zero or negligible gain) by cascade 300 in the reverse direction of the participating MPIJDA devices $302_1$ ... $302_N$.

Cascading MPIJDA 302 according to configuration 300 has the effective bandwidth over which cascading MPIJDA 302 can pass-through without amplification as, $$BW=\{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

Again, the non-amplification bandwidth BW of cascading MPIJDA 302 is greater than the non-amplification bandwidth of any single MPIJDA in configuration 300. Thus, cascading MPIJDA 302 is operable in the reverse direction to pass without gain a frequency multiplexed signal that spans a broader bandwidth than the operating bandwidth of a single MPIJDA. The near zero-gain reverse operation of cascading MPIJDA 302 shows multiplexed signals of frequencies $f_1$, $f_2$ ... $f_N$ propagating substantially unchanged from port 2 of cascading MPIJDA 302 (which is port 2 of the last MPIJDA in the cascade) to port 1 of cascading MPIJDA 302 (which is port 1 of the first MPIJDA in the cascade).

With reference to FIG. 5, this figure depicts a flowchart of an example process for propagation with or without amplification of signals of all frequencies in a frequency multiplexed microwave signal using cascading multi-path interferometric Josephson directional amplifiers with nonoverlapping bandwidths in accordance with an illustrative embodiment. Process 500 can be implemented using cascading MPIJDA 302 for the operations described in FIGS. 3 and 4.

Each Josephson device in a set of Josephson devices is configured as an MPIJDA (block 502). The MPIJDA devices are connected in a cascade by connecting one MPIJDA with another MPIJDA in a series connection (block 504). The MPIJDA devices in the series connection are configured such that all MPIJDA devices in the series amplify a microwave signal of their respective frequency in the same direction of signal flow in the cascade. The cascade is built by adding all MPIJDA devices from the set in series in this manner (block 506).

The cascade operates to amplify (as in FIG. 3) or pass with no or little amplification (as in FIG. 4) an input microwave signal where the signal is at a frequency corresponding to the bandwidth of any of the MPIJDA devices in the series (block 508).

FIGS. 6-8 now describe a different cascading configuration and a manner of operating the same, to selectively amplify or selectively pass without amplification signals of some but not all frequencies from a frequency multiplexed microwave signal.

With reference to FIG. 6, this figure depicts a block diagram of an example configuration and a selective amplification operation of a cascading MPIJDA in accordance with an illustrative embodiment. This cascading configuration amplifies only the signals of some frequencies in a frequency multiplexed microwave signal. Each of MPIJDA devices $602_1$, $602_2$ ... $602_N$ is an MPIJDA according to symbol 110. MPIJDA devices $602_1$-$602_N$ represent N MPI-JDA devices (N>1) that are cascaded in configuration 600.

A cascading of MPIJDA devices is a series connection of MPIJDA devices whereby an MPIJDA in the series can be connected such that a direction of amplification through the MPIJDA matches a direction of the signal flow through the series, or such that a direction of non-amplification (near zero gain) through the MPIJDA matches the direction of the signal flow through the series. For example, non-limiting example cascade 600 is formed by coupling port 1 of the first MPIJDA ($602_1$) to an external circuit for receiving a frequency multiplexed microwave signal input, in which case the direction of amplification through MPIJDA $602_1$ matches the signal flow direction in FIG. 6. Port 2 of the first MPIJDA ($602_1$) is coupled to port 2 of the next MPIJDA ($602_2$), in which case, the direction of amplification through MPIJDA $602_2$ matches the signal flow direction in FIG. 6. Port 1 of MPIJDA $602_2$ is coupled to port 1 of the next MPIJDA, in which case the direction of amplification through the next MPIJDA matches the signal flow direction in FIG. 6; and so on, until port 2 of N− 1th MPIJDA is coupled to port 2 of the last MPIJDA ($602_N$), and port 1 of the last MPIJDA ($602_N$) is coupled to an external circuit to which cascade 600 provides a microwave signal output. By the reverse direction flow through MPIJDA $602_N$, MPIJDA $602_N$ only passes with little amplification the signals whose frequencies are in its band.

Without implying any limitation, and only for the clarity of the description, example configuration 600 is depicted with only one MPIJDA ($602_N$) connected in reverse (direction of amplification of the MPIJDA is opposite of the signal flow direction through the cascade). Any number of MPIJDA devices can be coupled in series with their respective directions of amplification aligned with the direction of the signal flow, and any number of MPIJDA devices can be coupled in series with their respective directions of amplification opposite with the direction of the signal flow, to construct a cascade that selectively amplifies signals of certain frequencies. The cascade constructed in this manner amplifies (applies substantial gain to the power of) those signals whose frequencies lie within the bandwidth of the corresponding MPIJDA devices whose directions of amplification are aligned with the direction of the signal flow, and the cascade constructed in this manner passes (propagates with insignificant amplification) signals of those frequencies which correspond to those MPIJDA devices whose directions of amplification are opposite to the direction of the signal flow.

Thus, depending upon which group of signal frequencies from a frequency multiplexed microwave signal have to be propagated, one or more MPIJDA $602_1$-$602_N$ having bands corresponding to those frequencies are configured in cascade 600 such that some MPIJDA $602_1$-$602_N$ amplify a signal of a frequency in the input signal in the direction of the signal flow (direction of the rounded arrows in their respective symbols, which are all facing the same direction as the direction of signal flow). And depending upon which frequencies from a frequency multiplexed microwave signal have to be passed-through without amplification or with little amplification, one or more MPIJDA $602_1$-$602_N$ having bands corresponding to those frequencies are configured in cascade 600 such that those MPIJDA provide near zero gain in the signal flow direction (the direction of the rounded arrows in their respective symbols is opposite of signal flow direction).

Furthermore, each MPIJDA $602_1$-$602_N$ in cascade 600 operates in a substantially nonoverlapping frequency band.

For example, MPIJDA $602_1$ operates in a relatively narrow bandwidth ($BW_1$) where a center frequency is $f_1$, i.e., half of $BW_1$ is below $f_1$ and includes $f_1$ and half of $BW_1$ is above $f_1$. Therefore, $BW_1$ is [$f_1$−$BW_1$/2 to $f_1$+$BW_1$/2]. Similarly, MPIJDA $602_2$ has a center frequency $f_2$, and $BW_2$ of [$f_2$−$BW_2$/2 to $f_2$+$BW_2$/2]. And the MPIJDA devices in the set are defined in a similar manner until the (N−1)$^{th}$ MPIJDA has a center frequency $f_{N-1}$; and $BW_{N-1}$ of [$f_{N-1}$−$BW_{N-1}$/2 to $f_{N-1}$+$BW_{N-1}$/2], and MPIJDA $602_N$ has a center frequency $f_N$, and $BW_N$ of [$f_N$−$BW_N$/2 to $f_N$+$BW_N$/2]. $BW_1$ . . . $BW_N$ do not overlap, or overlap only by an insignificant amount.

An MPIJDA in cascading configuration 600 amplifies only the signals within the bandwidth of frequencies for which it is tuned. In other words, an MPIJDA will amplify (flowing in the direction from port 1 to port 2 of that MPIJDA) signals of those frequencies that fall within its operating bandwidth. The MPIJDA will pass in both directions, in a substantially zero-gain manner, signals of frequencies outside of the operating bandwidth of that MPIJDA.

For example, MPIJDA $602_2$ will only amplify a signal of frequency in $BW_2$ if flowing from port 1 of MPIJDA $602_2$ to port 2 of MPIJDA $602_2$, but will allow signals of frequencies in $BW_1$, $BW_3$, $BW_4$ . . . $BW_{N-1}$, $BW_N$ to pass in a substantially zero-gain manner in the amplifying direction. MPIJDA $602_2$ will allow signals of frequencies not only in $BW_2$ but also in $BW_1$, $BW_3$, $BW_4$ . . . $BW_{N-1}$, $BW_N$ to pass in a substantially zero-gain manner in the non-amplifying direction (port 2 to port 1). Each MPIJDA $602_1$ . . . $602_N$ in configuration 600 operates relative to its respective operating bandwidth and frequencies outside its operating bandwidth in this manner.

In configuration 600, MPIJDA $602_1$ amplifies a signal of frequency $f_1$ in the amplifying direction because MPIJDA $602_1$ amplifies the signals of frequencies in $BW_1$ and $f_1$ is in $BW_1$. MPIJDA $602_1$ allows signals of frequencies $f_2$ . . . $f_N$ to pass with zero gain because those frequencies are outside $BW_1$. Assuming that MPIJDA devices $602_2$ . . . $602_{N-1}$ in cascade 600 are configured in the amplifying direction, the multiplexed signal with reaches MPIJDA $602_N$. However, MPIJDA $602_N$ is configured in cascade 600 in a non-amplifying direction (direction of arrow 604 is reverse of direction of arrow 606), and therefore applies near zero gain to signal of frequency $f_N$ because MPIJDA $602_N$ has near zero gain for the signals of frequencies in $BW_N$ from port 2 to port 1, and $f_N$ is in $BW_N$. MPIJDA $602_N$ allows signals of frequencies $f_1$, $f_i$ . . . $f_{N-1}$ to pass with zero gain because those frequencies are outside $BW_N$. Thus, as depicted in this figure, an input signal that multiplexes signals of frequencies $f_1$ . . . $f_N$ is amplified through cascade 600 in selected frequencies $f_1$ . . . $f_{N-1}$ with signal of frequency $f_N$ having been selectively passed without amplification from the input signal.

To generalize, if input signal (at port 1 of the cascade) has signals of frequencies $f_A$, $f_B$, $f_C$, $f_D$, $f_E$, $f_F$, $f_G$, and $f_H$, MPIJDA A (amplifies signal at $f_A$), C (amplifies signal at $f_C$), E (amplifies signal at $f_E$), G (amplifies signal at $f_G$) are oriented in the cascade such that they amplify in the signal flow direction, and MPIJDA B (amplifies signal at $f_B$), D (amplifies signal at $f_D$), F (amplifies signal at $f_F$), and H (amplifies signal at $f_H$) are oriented in the cascade such that they pass signals without amplification or with insignificant amplification in the signal flow direction, then the output signal (at port 2 of the cascade) will contain amplified signals of $f_A$, $f_C$, $f_E$, and $f_G$, and will contain nearly un-amplified signals of $f_B$, $f_D$, $f_F$, and $f_H$.

The effective bandwidth over which cascade 600 can selectively amplify signals of certain frequencies is therefore, $$BW=\{[f_1-BW_1/2 \text{ to } f_1+BW_1/2], [f_2-BW_2/2 \text{ to } f_2+BW_2/2], \ldots [f_N-BW_N/2 \text{ to } f_N+BW_N/2]\}$$

The near zero-gain pass-through or amplification bandwidth BW of cascade 600 is greater than the near zero-gain pass-through or amplification bandwidth of any single MPIJDA in configuration 600. Thus, cascade 600 is operable to selectively amplify signals of certain frequencies in a frequency multiplexed signal that spans a broader bandwidth than the operating bandwidth of a single MPIJDA.

With reference to FIG. 7, this figure depicts a block diagram of an example selective amplification operation of a cascading MPIJDA in accordance with an illustrative embodiment. This cascading configuration selectively amplifies signals of some but not all frequencies in a frequency multiplexed microwave signal. Cascade 600 and MPIJDA devices $602_1$, $602_2 \ldots 602_N$ are the same as in FIG. 6. Frequency $f_1$ is in $BW_1$ of MPIJDA $602_1$, $f_2$ is in $BW_2$ of MPIJDA $602_2 \ldots f_{N-1}$ is in $BW_{N-1}$ of $(N-1)^{th}$ MPIJDA, and $f_N$ is in $BW_N$ of MPIJDA $602_N$.

In the selective amplification operation of this figure, signals of frequencies $f_1, f_2 \ldots f_N$ are input in the shown signal flow direction at port 2 of cascade 600, to wit, at port 1 of the last MPIJDA ($602_N$) in cascade 600. In this operation of cascade 600, MPIJDA $602_N$ amplifies signal of frequency $f_N$ and allows signals of frequencies $f_{N-1} \ldots f_1$ which are out of bandwidth $BW_N$ to pass in the amplifying direction because MPIJDA $602_N$ amplifies the signals of frequencies only in $BW_N$ and $f_N$ is in $BW_N$. (Compare the size of the arrows representing each frequency at each MPIJDA in cascade 600). Operating in this manner, MPIJDA $602_N$ has effectively selectively amplified the signal only at frequency $f_N$ from the multiplexed input microwave signal. N-$1^{th}$ MPIJDA passes signals of in-band frequency $f_{N-1}$ and frequencies $f_{N-2} \ldots f_1$ which are out of bandwidth $BW_{N-1}$ with substantially zero gain in the reverse direction. MPIJDA $602_N$ has already amplified the signal of frequency $f_N$, and the amplified signal of out-of-band $f_N$ also passes with zero gain through MPIJDA $602_{N-1}$.

Operating in this manner, depending on the orientation of the MPIJDA in cascade 600, each MPIJDA either amplifies or passes with little amplification a signal of that frequency which is within the bandwidth of that MPIJDA. Because MPIJDA $602_2$ is amplifying in the opposite direction of the signal flow, MPIJDA $602_2$ passes with little amplification the signal of frequency $f_2$. MPIJDA $602_2$ passes without amplification the signal at $f_1$ for being out of $BW_2$. MPIJDA $602_1$ passes without amplification the signal at frequency $f_1$ for being in the reverse direction, and propagates the signal at $f_2$ for being out of $BW_1$. Thus, the output signal at port 1 of cascade 600, to wit, at port 1 of MPIJDA $602_1$, includes unamplified signals of frequencies $f_1 \ldots f_{N-1}$ and the signal at frequency $f_N$ which has been selectively amplified from the multiplexed input signal $f_1 \ldots f_N$. Thus, as depicted in this figure, an input signal that multiplexes frequencies $f_1 \ldots f_N$ is selectively amplified (signals of only some but not all frequencies are amplified) by cascade 600.

Cascade 600 has the effective bandwidth over which cascading MPIJDA 602 can selectively amplify signals in the reverse direction as, $$BW=\{[f_1-BW_2/2 \text{ to } f_1+BW_2/2], [f_2-BW_2/2 \text{ to } f_2+BW_2/2], \ldots [f_N-BW_N/2 \text{ to } f_N+BW_N/2]\}$$

Again, the selective amplification bandwidth BW of cascade 600 in the reverse direction is greater than the amplification bandwidth of any single MPIJDA in configuration 600. Thus, cascade 600 is operable to selectively amplify signals of some frequencies from a frequency multiplexed signal that spans a broader bandwidth than the operating bandwidth of a single MPIJDA.

Again, without implying any limitation, and only for the clarity of the description, example configuration 600 is depicted with only one MPIJDA ($602_N$) connected with a direction of propagation that is aligned with the signal flow direction through the cascade. Any number of MPIJDA devices can be coupled in series with their respective directions of amplification aligned with the direction of the signal flow, and any number of MPIJDA devices can be coupled in series with their respective directions of amplification opposite the direction of the signal flow, to construct a cascade that selectively amplifies signals of certain frequencies. The cascade constructed in this manner passes through with near zero gain signals of those frequencies which correspond to the MPIJDA devices whose directions of propagation are opposite the direction of the signal flow, and amplifies signals of those frequencies which correspond to those MPIJDA devices whose directions of amplification are aligned with the direction of the signal flow.

To generalize, if the input signal (at port 2 of the cascade) has signals of frequencies $f_A$, $f_B$, $f_C$, $f_D$, $f_E$, $f_F$, $f_G$, and $f_H$, MPIJDA A (amplifies signal of $f_A$), C (amplifies signal of $f_C$), E (amplifies signal of $f_E$), G (amplifies signal of $f_G$) are oriented in the cascade such that they amplify in the signal flow direction, and MPIJDA B (amplifies signal of $f_B$), D (amplifies signal of $f_D$), F (amplifies signal of $f_F$), and H (amplifies signal of $f_H$) are oriented in the cascade such that they pass-through with near zero gain in the signal flow direction, then the output signal (at port 1 of the cascade) will contain amplified signals of frequencies $f_A$, $f_C$, $f_E$, and $f_G$ while signals of $f_B$, $f_D$, $f_F$, and $f_H$ are passed through nearly unamplified.

With reference to FIG. 8, this figure depicts a flowchart of an example process for near zero-gain propagation or amplification of signals of some but not all frequencies in a frequency multiplexed microwave signal using cascading multi-path interferometric Josephson directional amplifiers with nonoverlapping bandwidths in accordance with an illustrative embodiment. Process 800 can be implemented using cascade 600 for the operations described in FIGS. 6 and 7.

Each Josephson device in a set of Josephson devices is configured as an MPIJDA (block 802). The MPIJDA devices are connected in a cascade by connecting one MPIJDA with another MPIJDA in a series connection (block 804). The MPIJDA devices in the series connection are configured such that at least some MPIJDA devices (reverse MPIJDA devices) in the series pass through with near zero gain a microwave signal of their respective frequency in the direction of signal flow in the cascade. The cascade is built by adding all MPIJDA devices from the set in series in this manner (block 806).

The cascade operates to selectively amplify (as in FIG. 6) or selectively propagate with near zero gain (as in FIG. 7) a frequency multiplexed input microwave signal where the signal contains a frequency corresponding to any of the reversed MPIJDA devices in the series (block 808).

The circuit elements of the MPIJDA device and connections thereto can be made of superconducting material. The respective resonators and transmission/feed/pump lines can be made of superconducting materials. The hybrid couplers can be made of superconducting materials. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method to form a cascading microwave directional amplifier (cascade), the method comprising:
    fabricating a set of Josephson devices, each Josephson device in the set having a corresponding operating bandwidth of microwave frequencies, wherein different operating bandwidths have different corresponding center frequencies; and
    forming a series coupling between first Josephson device from the set and an $n^{th}$ Josephson device from the set, wherein the series coupling causes
        the first Josephson device to amplify a signal of a first frequency from a frequency multiplexed microwave signal (multiplexed signal) and propagate without amplification a signal of an $n^{th}$ frequency from the multiplexed signal in a first signal flow direction through the series coupling, and
        the $n^{th}$ Josephson device to amplify the signal of the $n^{th}$ frequency and propagate without amplification the signal of the first frequency from the multiplexed signal in the first signal flow direction through the series.

2. A cascading microwave directional amplifier (cascade) comprising:
    a set of Josephson devices, each Josephson device in the set having a corresponding operating bandwidth of microwave frequencies, wherein different operating bandwidths have different corresponding center frequencies; and
    a series coupling between first Josephson device from the set and an $n^{th}$ Josephson device from the set, wherein the series coupling causes
        the first Josephson device to amplify a signal of a first frequency from a frequency multiplexed microwave signal (multiplexed signal) and propagate without amplification a signal of an $n^{th}$ frequency from the multiplexed signal in a first signal flow direction through the series coupling, and
        the $n^{th}$ Josephson device to amplify the signal of the $n^{th}$ frequency and propagate without amplification the signal of the first frequency from the multiplexed signal in the first signal flow direction through the series.

3. The cascade of claim 2, further comprising:
    an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device amplifies a signal of an $(n-1)^{th}$ frequency from the multiplexed signal in the first signal flow direction.

4. The cascade of claim 2, wherein the series coupling causes the first Josephson device and the $n^{th}$ Josephson device to propagate without amplification signals of all frequencies from the multiplexed signal in a second signal flow direction through the series coupling, wherein the second signal flow direction is opposite of the first signal flow direction, and wherein the first signal flow direction is a direction of amplification of the first Josephson device and the $n^{th}$ Josephson device.

5. The cascade of claim 2, wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

6. The cascade of claim 5, wherein a total amplification bandwidth of the cascade comprises the first operating bandwidth and the $n^{th}$ operating bandwidth.

7. The cascade of claim 2, wherein the first Josephson device in the set of Josephson devices is an MPIJDA, comprises:
a first nondegenerate microwave parametric amplifier device (first parametric amplifier);
a second nondegenerate microwave parametric amplifier device (second parametric amplifier);
a first input/output (I/O) port coupled to an input port of the first parametric amplifier and an input port of the second parametric amplifier; and
a second I/O port coupled to the input port of the first parametric amplifier and the input port of the second parametric amplifier, wherein the signal of a first frequency communicated between the first I/O port and the second I/O port is transmitted while propagating in a first direction between the first I/O port to the second I/O port through the first parametric amplifier and the second parametric amplifier and is substantially unamplified while propagating in a second direction between the second I/O port to the first I/O through the first parametric amplifier and the second parametric amplifier, and wherein the first frequency is in a first operating bandwidth of the first Josephson device.

8. The cascade of claim 7, further comprising:
a first microwave pump injecting a first microwave drive into the first parametric amplifier at a pump frequency and a first pump phase, wherein the first microwave pump is configured to cause the first parametric amplifier to operate at a low power gain working point; and
a second microwave pump injecting a second microwave drive into the second parametric amplifier at the pump frequency and a second pump phase wherein the second microwave pump is configured to cause the second parametric amplifier to operate at the low power gain working point.

9. The cascade of claim 7, wherein the first parametric amplifier and the second parametric amplifier are each a nondegenerate three-wave-mixing parametric amplifier.

10. The cascade of claim 7, wherein the first parametric amplifier and the second parametric amplifier are each a Josephson parametric converter (JPC), and wherein the first parametric amplifier and the second parametric amplifier are nominally identical.

11. A superconductor fabrication system which when operated to fabricate a cascading microwave directional amplifier (cascade) performing operations comprising:
fabricating a set of Josephson devices, each Josephson device in the set having a corresponding operating bandwidth of microwave frequencies, wherein different operating bandwidths have different corresponding center frequencies; and
forming a series coupling between first Josephson device from the set and an $n^{th}$ Josephson device from the set, wherein the series coupling causes
the first Josephson device to amplify a signal of a first frequency from a frequency multiplexed microwave signal (multiplexed signal) and propagate without amplification a signal of an $n^{th}$ frequency from the multiplexed signal in a first signal flow direction through the series coupling, and
the $n^{th}$ Josephson device to amplify the signal of the $n^{th}$ frequency and propagate without amplification the signal of the first frequency from the multiplexed signal in the first signal flow direction through the series.

12. The superconductor fabrication system of claim 11, wherein the first Josephson device in the set of Josephson devices is an MPIJDA, comprises:
a first nondegenerate microwave parametric amplifier device (first parametric amplifier);
a second nondegenerate microwave parametric amplifier device (second parametric amplifier);
a first input/output (I/O) port coupled to an input port of the first parametric amplifier and an input port of the second parametric amplifier; and
a second I/O port coupled to the input port of the first parametric amplifier and the input port of the second parametric amplifier, wherein the signal of a first frequency communicated between the first I/O port and the second I/O port is transmitted while propagating in a first direction between the first I/O port to the second I/O port through the first parametric amplifier and the second parametric amplifier and is substantially unamplified while propagating in a second direction between the second I/O port to the first I/O through the first parametric amplifier and the second parametric amplifier, and wherein the first frequency is in a first operating bandwidth of the first Josephson device.

13. The superconductor fabrication system of claim 12, further comprising:
a first microwave pump injecting a first microwave drive into the first parametric amplifier at a pump frequency and a first pump phase, wherein the first microwave pump is configured to cause the first parametric amplifier to operate at a low power gain working point; and
a second microwave pump injecting a second microwave drive into the second parametric amplifier at the pump frequency and a second pump phase wherein the second microwave pump is configured to cause the second parametric amplifier to operate at the low power gain working point.

14. The superconductor fabrication system of claim 12, wherein the first parametric amplifier and the second parametric amplifier are each a nondegenerate three-wave-mixing parametric amplifier.

15. The superconductor fabrication system of claim 11, wherein the series coupling causes the first Josephson device and the $n^{th}$ Josephson device to propagate without amplification signals of all frequencies from the multiplexed signal in a second signal flow direction through the series coupling, wherein the second signal flow direction is opposite of the first signal flow direction, and wherein the first signal flow direction is a direction of amplification of the first Josephson device and the $n^{th}$ Josephson device.

16. The superconductor fabrication system of claim 11, wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

17. The superconductor fabrication system of claim 16, wherein a total amplification bandwidth of the cascade comprises the first operating bandwidth and the $n^{th}$ operating bandwidth.

18. The superconductor fabrication system of claim 11, further comprising:

an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device amplifies a signal of an $(n-1)^{th}$ frequency from the multiplexed signal in the first signal flow direction.

* * * * *